United States Patent [19]
Ovshinsky et al.

[11] Patent Number: 4,954,182
[45] Date of Patent: Sep. 4, 1990

[54] MULTIPLE CELL PHOTORESPONSIVE AMORPHOUS PHOTO VOLTAIC DEVICES INCLUDING GRADED BAND GAPS

[75] Inventors: Stanford R. Ovshinsky, Bloomfield Hills, Mich.; David Adler, Lexington, Mass.

[73] Assignee: Energy Conversion Devices, Inc., Troy, Mich.

[21] Appl. No.: 301,916

[22] Filed: Mar. 13, 1989

Related U.S. Application Data

[63] Continuation of Ser. No. 710,947, Mar. 13, 1965, Pat. No. 4,891,074, which is a continuation of Ser. No. 427,757, Sep. 29, 1982, abandoned, which is a continuation of Ser. No. 206,580, Nov. 13, 1980, abandoned.

[51] Int. Cl.$^5$ ............................................. H01L 31/06
[52] U.S. Cl. ................................... 136/249; 136/258; 357/30
[58] Field of Search ................. 136/249 TJ, 258 AM; 357/30 J, 30 K, 30 N

[56] References Cited

U.S. PATENT DOCUMENTS

| | | | |
|---|---|---|---|
| 3,186,873 | 6/1965 | Dunlap, Jr. | 136/249 TJ |
| 4,251,287 | 2/1981 | Dalal | 136/258 AM |

OTHER PUBLICATIONS

Y. Marfaing, Proceedings, 2nd *E. C. Photovoltaic Solar Energy Conf.* (1979), pp. 287–294.
J. Chevallier et al, *Solid State Communications*, vol. 24, pp. 867–869 (1977).

*Primary Examiner*—Aaron Weisstuch
*Attorney, Agent, or Firm*—Marvin S. Siskind; Richard M. Goldman; Kenneth M. Massaron

[57] ABSTRACT

The production of improved multiple cell photovoltaic amorphous silicon devices having improved wavelength threshold characteristics is made possible by adding one or more band gap adjusting elements to the silicon alloy material in one or more cells of the device. The adjusting element or elements are added at least to the active photoresponsive regions of constituent amorphous silicon cells, which regions preferably further include at least one of fluorine and hydrogen. One adjusting element is germanium which narrows the band gap from that of the silicon alloy materials without the adjusting element incorporated thereinto. Other adjusting elements can be used, such as carbon or nitrogen to widen the band gap. The silicon and adjusting elements are concurrently combined and deposited as amorphous silicon alloys by glow discharge decomposition techniques.

8 Claims, 4 Drawing Sheets

MULTIPLE CELL PHOTORESPONSIVE AMORPHOUS PHOTO VOLTAIC DEVICES INCLUDING GRADED BAND GAPS

This application is a continuation of application Ser. No. 710,947 filed on Mar. 13, 1985, now U.S. Pat. No. 4,891,074, cntinuation of application Ser. No. 427,757 filed on Sept. 29, 1982 (now abandoned) which is a continuation of application Ser. No. 206,580 filed on Nov. 13, 1980 (now abandoned).

CROSS REFERENCES TO RELATED APPLICATIONS

This application is related to: application Ser. No. 185,520, filed Sept. 9, 1980, for METHOD FOR OPTIMIZING PHOTORESPONSIVE AMORPHOUS ALLOYS AND DEVICES, now abandoned; copending application Ser. No. 206,579, filed Nov. 13, 1980, for METHOD FOR GRADING THE BAND GAPS OF AMORPHOUS ALLOYS AND DEVICES, now abandoned; copending application Ser. No. 206,476, filed Nov. 13, 1980, for METHOD FOR INCREASING THE BAND GAP IN PHOTORESPONSIVE AMORPHOUS ALLOYS AND DEVICES, now abandoned; and copending application Ser. No. 206,477, filed Nov. 13, 1980 with for METHOD OF MAKING PHOTORESPONSIVE AMORPHOUS GERMANIUM ALLOYS AND DEVICES, now abandoned, the disclosures of which are incorporated herein by reference.

BACKGROUND OF THE INVENTION

This invention relates to an improved amorphous alloy device having improved photoresponsive characteristics. The invention has its most important application in making multiple cell photoresponsive alloy devices having tailor made band gaps for specific photoresponsive applications including photovoltaic devices such as solar cells of a p-i-n, Schottky or MIS (metal-insulator-semiconductor) type.

Silicon is the basis of the huge crystalline semiconductor industry and is the material which has produced expensive high efficiency (18 per cent) crystalline solar cells. When crystalline semiconductor technology reached a commercial state, it became the foundation of the present huge semiconductor device manufacturing industry. This was due to the ability of the scientist to grow substantially defect-free germanium and particularly silicon crystals, and then turn them into extrinsic materials with p-type and n-type conductivity regions therein. This was accomplished by diffusing into such crystalline material parts per million of donor (n) or acceptor (p) dopant materials introduced as substitutional impurities into the substantially pure crystalline materials, to increase their electrical conductivity and to control their being either of a p or n conduction type. The fabrication processes for making p-n junction crystals involve extermely complex, time consuming, and expensive procedures. Thus, these crystalline materials useful in solar cells and current control devices are produced under very carefully controlled conditions by growing individual single silicon or germanium crystals, and when p-n junctions are required, by doping such single crystals with extremely small and critical amounts of dopants.

These crystal growing processes produce such relatively small crystals that solar cells require the assembly of many single crystals to encompass the desired area of only a single solar cell panel. The amount of energy necessary to make a solar cell in this process, the limitation caused by the size limitations of the silicon crystal, and the necessity to cut up and assemble such a crystalline material have all resulted in an impossible economic barrier to the large scale use of crystalline semiconductor solar cells for energy conversion. Further, crystalline silicon has an indirect optical edge which results in poor light absorpiton in the material. Because of the poor light absorption, crystalline solar cells have to be at least 50 microns thick to absorb the incident sunlight. Even if the single crystal material is replaced by polycrystalline silicon with cheaper production processes, the indirect optical edge is still maintained; hence the material thickness is not reduced. The polycrystalline material also involves the addition of grain boundaries and other problem defects.

An additional shortcoming of the crystalline material, for solar applications, is that the crystalline silicon band gap of about 1.1 eV inherently is below the optimum band gap of about 1.5 eV. The admixture of germanium, while possible, further narrows the band gap which further decreases the solar conversion efficiency.

In summary, crystal silicon devices have fixed parameters which are not variable as desired, require large amounts of material, are only producible in relatively small areas and are expensive and time consuming to produce. Devices manufactured with amorphous silicon can eliminate these crystal silicon disadvantages. Amorphous silicon has an optical absorption edge having properties similar to a direct gap semiconductor and only a material thickness of one micron or less is necessary to absorb the same amount of sunlight as the 50 micron thick crystalline silicon. Further, amorphous silicon can be made faster, easier and in larger areas than can crystal silicon.

Accordingly, a considerable effort has been made to develop processes for readily depositing amorphous semiconductor alloys or films, each of which can encompass relatively large areas, if desired, limited only by the size of the deposition equipment, and which could be readily doped to form p-type and n-type materials where p-n junction devices are to be made therefrom equivalent to those produced by their crystalline counterparts. For many years such work was substantially unproductive. Amorphous silicon or germanium (Group IV) films are normally four-fold coordinated and were found to have microvoids and dangling bonds and other defects which produce a high density of localized states in the energy gap thereof. The presence of a high density of localized states in the energy gap of amorphous silicon semiconductor films results in a low degree of photoconductivity and short carrier lifetime, making such films unsuitable for photoresponsive applications. Additionally, such films cannot be successfully doped or otherwise modified to shift the Fermi level close to the conduction or valence bands, making them unsuitable for making p-n junctions for solar cell and current control device applications.

In an attempt to minimize the aforementioned problems involved with amorphous silicon and germanium, W. E. Spear and P. G. Le Comber or Carnegie Laboratory of Physics, University of Dundee, in Dundee, Scotland, did some work on "Substitutional Doping of Amorphous Silicon", as reported in a paper published in *Solid State Communications*, Vol. 17, pp. 1193–1196 (1975), toward the end of reducing the localized states in the energy gap in amorphous silicon or germanium to make the same approximate more closely intrinsic crystalline silicon or germanium and of substitutionally doping the amorphous materials with suitable classic dopants, as in doping crystalline materials, to make them extrinsic and of p or n conduction types.

The reduction of the localized states was accomplished by glow discharge deposition of amorphous silicon films wherein a gas of silane ($SiH_4$) was passed through a reaction tube where the gas was decomposed by an r.f. glow discharge and deposited on a substrate at a substrate temperature of about 500°–600° K. (227°–327° C.). The material so deposited on the substrate was an intrinsic amorphous material consisting of silicon and hydrogen. To produce a doped amorphous material a gas of phosphine ($PH_3$) for n-type conduction or a gas of diborane ($B_2H_6$) for p-type conduction were premixed with the silane gas and passed through the glow discharge reaction tube under the same operating conditions. The gaseous concentration of the dopants used was between about $5 \times 10^{-6}$ and $10^{-2}$ parts per volume. The material so deposited including supposedly substitutional phosphorus or boron dopant and was shown to be extrinsic and of n or p conduction type.

While it was not known to these researchers, it is now known by the work of others that the hydrogen in the silane combines at an optimum temperature with many of the dangling bonds of the silicon during the glow discharge deposition, to substantially reduce the density of the localized states in the energy gap toward the end of making the amorphous material approximate more nearly the corresponding crystalline material.

D. I. Jones, W. E. Spear, P. G. LeComber, S. Li, and R. Martins also worked on preparing a Ge:H from $GeH_4$ using similar deposition techniques. The material obtained gave evidence of a high density of localized states in the energy gap thereof. Although the material could be doped the efficiency was substantially reduced from that obtainable with a-Si:H. In this work reported in *Philsophical Magazine B*, Vol. 39, p. 147 (1979) the authors conclude that because of the large density of gap states the material obtained is "... a less attractive material than a-Si for doping experiments and possible applications."

In working with a similar method of glow discharge fabricated amorphous silicon solar cells utilizing silane, D. E. Carlson attempted to utilize germanium in the cells to narrow the optical gap toward the optimum solar cell value of about 1.5 eV from his best fabricated solar cell material which has a band gap of 1.65–1.70 eV. (D. E. Carlson, *Journal of Non Crystalline Solids*, Vol. 35 and 36 (1980) pp. 707–717, given at 8th International Conference on Amorphous and Liquid Semi-Conductors, Cambridge, Mass., Aug. 27–31, 1979). However, Carlson has further reported that the addition of germanium from germane gas was unsuccessful because it causes significant reductions in all of the photovoltaic parameters of the solar cells. Carlson indicated that the degradation of photovoltaic properites indicates that defects in the energy gap are being created in the deposited films. (D. E. Carlson, *Tech. Dig. 1977 IEDM*, Washington, D.C., p. 214).

The concept of utilizing multiple cells to enhance photvoltaic device efficiency was discussed at least as early a 1955 by E. D. Jackson, U.S. Pat. No. 2,949,498 issued Aug. 16, 1960. The multiple cell structures discussed utilized p-n junction crystalline semiconductor devices, but the enhancement concepts are similar whether amorphous or crystalline devices are utilized. Essentially the concept is directed to utilizing different band gap devices to more efficiently collect various portions of the solar spectrum and to increase Voc. The stacked cell device has two or more cells with the light directed serially through each cell, with a large band gap material followed by a smaller band gap material to absorb the light passed through the first cell or layer.

Many articles on crystalline stacked cells following Jackson, have been reported and more recently several articles dealing with a Si-H materials utilized in stacked cell have been published. Marfaing proposed utilizing silane deposited amorphous Si-Ge alloys in stacked cells, but did not report the feasibility of doing so. (Y. Marfaing, *Proc. 2nd European Communities Photovoltaic Solar Energy Conf.*, Berlin, West Germany, p. 287, (1979).

Hamakawa et al, reported the feasibility of utilizing a-SiH in a configuration which will herein be defined as a cascade type multiple cell. The cascade cell is hereinafter referred to as a multiple cell without a separation or insulating layer between each of the cells. Each of the cells was made of a-Si:H material of the same band gap in a p-i-n junction configuration. Matching of the short circuit current (Jsc) was attempted by increasing the thickness of the cells in the serial light path. As expected the overall device Voc increased and was proportional to the number of cells.

In a recent report on increasing the cell efficiency of multiple-junction (stacked) solar cells of amorphous silicon (a-Si:H) deposited from silane in the above manner, it was reported that "[g]ermanium has been found to be a deleterious impurity in a-Si:H, lowering its $J_{sc}$ exponentially with increasing Ge..." From their work as well as that of Carlson, Marfaing and Hamakawa they concluded that alloys of amorphous silicon, germanium and hydrogen "have shown poor photovoltaic properties" and thus new "photovoltaic film cell materials must be found having spectral response at about 1 micron for efficient stacked cell combinations with a-Si:H." (J. J. Hanak, B. Faughnan, V. Korsun, and J. P. Pellicane, presented at the 14*th IEEE Photovoltaic Specialists Conference*, San Diego, California, Jan. 7–10, 1980).

The incorporation of hydrogen in the above method not only has limitations based upon the fixed ratio of hydrogen to silicon in silane, but, also, various Si:H bonding configurations introduce new antibonding states which can have deleterious consequences in these materials. Perhaps most importantly hydrogen is incapable of compensating or removing defect states produced by the introduction of germanium into the alloy. Therefore, there are basic limitations in reducing the density of localized states in these materials which are particularly harmful in terms of effective p as well as n doping. The resulting density of states of the silane deposited materials leads to a narrow depletion width, which in turn limits the efficiencies of solar cells and other devices whose operation depends on the drift of free carriers. The method of making these materials by the use of only silicon and hydrogen also results in a high density of surface states which affects all the above parameters. Further, the previous attempts to decrease the band gap of the material while successful in reducing the gap have at the same time added states in the gap. The increase in the states in the band gap results in a decrease or total loss in photoconductivity and is thus counterproductive in producing photoresponsive devices.

Grading of the band gap of crystalline p-n junction silicon photovoltaic solar cells was suggested in 1960 by Wolf, "Limitations And Possibilities For Improvement Of Photovoltaic Solar Energy Converters," *Proc. IRE*, VOL. 48, pp. 1246–1263; 1960. At the time of his report, Wolf concluded that the preparation of crystalline semiconductor materials with graded energy gaps was technically possible but their application to photovoltaic cells did not appear to be very useful because of the loss in $V_{oc}$.

D. E. Carlson, in the *Journal of Non-Crystalline Solids*, Vol. 35 and 36 (1980), pp. 707–717 also suggested that grading the band gap in silane deposited devices "may improve the device performance". No suggestion was made however on how to grade the band gap over any significant range, other than the suggestion of adding germanium which Carlson also has reported as a failure. No suggestion of increasing the band gap was made whatsoever.

Later, Carlson suggested that the band gap of amorphous silicon solar cells in a silane environment may be graded to provide a potential gradient that would assist in the collection of photogenerated carriers. However, it was not known how such gradient could be accomplished without adding germanium to the amorphous Si:H which, as previously noted, was recognized by Carlson to cause significant reduction in all of the photovoltaic parameters of the solar cells.

After the development of the glow discharge deposition of silicon from silane gas was carried out, work was done on the sputter depositing of amorphous silicon films in the atmosphere of mixture of argon (required by the sputtering deposition process) and molecular hydrogen, to determine the results of such molecular hydrogen on the characteristics of the deposited amorphous silicon film. This research indicated that the hydrogen acted as a compensating agent which bonded in such a way as to reduce the localized states in the energy gap. However, the degree to which the localized states in the energy gap were reduced in the sputter deposition process was much less than that achieved by the silane deposition process described above. The above described p and n dopant gases also were introduced in the sputtering process to produce p and n doped materials. These materials had a lower doping efficiency than the materials produced in the glow discharge process. Neither process produced efficient p-doped materials with sufficiently high acceptor concentrations for producing commercial p-n or p-i-n junction devices. The n-doping efficiency was below desirable acceptable commercial levels and the p-doping was particularly undesirable since it reduced the width of the band gap and increased the number of localized states in the band gap.

The prior deposition of amorphous silicon, which has been altered by hydrogen from the silane gas in an attempt to make it more closely resemble crystalline silicon and which has been doped in a manner like that of doping crystalline silicon, has characteristics which in all important respects are inferior to those of doped cyrstalline silicon.

Thus, inadequate doping efficiencies and conductivity were achieved especially in the p-type material, and the photo-voltaic qualities of these silicon films left much to be desired.

Greatly improved amorphous silicon alloys having significantly reduced concentrations of localized states in the energy gaps thereof and high quality electronic properties have been prepared by glow discharge as fully described in U.S. Pat. No. 4,226,898, Amorphous Semiconductors Equivalent to Crystalline Semiconductors, Stanford R. Ovshinsky And Arun Madan which issued Oct. 7, 1980, and by vapor deposition as fully described in U.S. Pat. No. 4,217,374, Stanford R. Ovshinsky and Masatsugu Izu, which issued on Aug. 12, 1980, under the same title. As disclosed in these patents, which are incorporated herein by reference, fluorine is introduced into the amorphous silicon semiconductor to substantially reduce the density of localized states therein.

Activated fluorine especially readily diffuses into and bonds to the amorphous silicon in the matrix body, substantially to decrease the density of localized defect states therein, because the small size of the fluorine atoms enables them to be readily introduced into the amorphous silicon matrix. The fluorine bonds to the dangling bonds of the silicon and forms what is believed to be a partially ionic stable bond with flexible bonding angles, which results in a more stable and more efficient compensation or alteration than is formed by hydrogen and other compensating or altering agents. Fluorine is considered to be a more efficient compensating or altering element than hydrogen when employed alone or with hydrogen because of its exceedingly small size, high reactivity, specificity in chemical bonding, and highest electronegativity. Hence, fluorine is qualitatively different from other halogens and so is considered a super-halogen.

As an example, compensation may be achieved with fluorine alone or in combination with hydrogen with the addition of these element(s) in very small quantities (e.g., fractions of one atomic percent). However, the amounts of fluorine and hydrogen most desirably used are much greater than such small percentages so as to form a silicon-hydrogen-fluorine alloy. Such alloying amounts of fluorine and hydrogen may, for example, be in the range of 1 to 5 percent or greater. It is believed that the new alloy so formed has a lower density of defect states in the energy gap than that achieved by the mere neutralizaiton of dangling bonds and similar defect states. Such larger amount of fluorine, in particular, is believed to participate substantially in a new structural configuration of an amorphous silicon-containing material and facilitates the addition of other alloying materials, such as germanium. Fluorine, in addition to its other characteristics mentioned herein, is believed to be an organizer of local structure in the silicon-containing alloy through inductive and ionic effects. It is believed that fluorine also influences the bonding of hydrogen by acting in a beneficial way to decrease the density of defect states which hydrogen contributes while acting as a density of states reducing element. The ionic role that fluorine plays in such an alloy is believed to be an important factor in terms of the nearest neighbor relationships.

SUMMARY OF THE INVENTION

The non optimum spectral response of prior art amorphous photoresponsive devices is overcome in accordance with the present invention by providing two or more band gap adjusted amorphous photoresponsive alloy cells to adjust the device band gap to the optimum utilization characteristics for particular applications without substantially increasing the deleterious states in the gap. An enhanced spectral response of amorphous silicon photoresponsive devices and an improved collection of photogenerated carriers is thereby provided in accordance with the present invention by adding one or more band gap adjusting elements in continuously varying amounts to an amorphous photoresponsive alloy at least in one or more portions of the photocurrent generation region thereof to grade the band gap. Thus, the high quality electronic properties of the material are not substantially affected in forming the new band gap adjusted multiple cell devices.

The amorphous alloys preferably incorporate at least one density of states reducing element, fluorine. The compensating or altering element, fluorine, and/or other elements can be added during deposition or thereafter. The adjusting element(s) can be activated and may be added in vapor deposition, sputtering or glow discharge processes. The band gap can be adjusted as required for a specific device application by introducing the necessary amount of one or more of the adjusting elements into the deposited alloy cells in at least the photocurrent generation region thereof for at least some of the cells of the device.

The band gap of the cells is adjusted without substantially increasing the number of states in the band gap of the alloy because of the presence of fluorine in the alloy. The prior silane deposited films typically are deposited on substrates heated to 250° C. to 350° C. to maximize the incorporation and compensation of silicon with hydrogen in the films. The prior attempts to add germanium to this film fail because the hydrogen germanium bond is too weak to be stable at the required deposition substrate temperature.

The presence of fluorine in the alloy of the invention provides a silicon alloy which differs physically, chemically and electrochemically from other silicon alloys because fluorine not only covalently bonds to the silicon but also effects in a positive manner the structural short range order of the material. This allows adjusting elements, such as germanium, tin, carbon, or nitrogen effectively to be added to the alloy, because fluorine forms the stronger and more stable bonds than does hydrogen. Fluourine compensates or alters silicon as well as germanium and the other band adjusting element(s) in the alloy more efficiently than hydrogen, because of the stronger more thermally stable bonds and more flexible bonding configurations due to the ionic nature of the fluorine bonding. The use of fluorine produces the alloy or film, described in U.S. Pat. No. 4,217,374, in which the density of states in the band gap are much lower than those produced by a combination of silicon and hydrogen, such as from silane. Since the band adjusting element(s) has been tailored into the cells without adding substantial deleterious states, because of the influence of fluorine, the new cell alloy maintains high quality electronic qualities and photoconductivity when the adjusting element(s) are added to tailor the device wavelength characteristics for a specific photoresponse application. Hydrogen further enhances the fluorine compensated or altered alloy and can be added during deposition with fluorine or after deposition, as can fluorine and other alterant elements. The post deposition incorporation of hydrogen is advantageous when it is desired to utilize the higher deposition substrate temperatures allowed by fluorine.

While the principles of this invention apply to each of the aforementioned deposition processes, for purposes of illustration herein a vapor and a plasma activated vapor deposition environment are described. The glow discharge system disclosed in U.S. Pat. No. 4,226,898, has other process variables which advantageously can be utilized with the principles of this invention.

DESCRIPTION OF THE PREFERRED EMBODIMENTS

Figure 1:
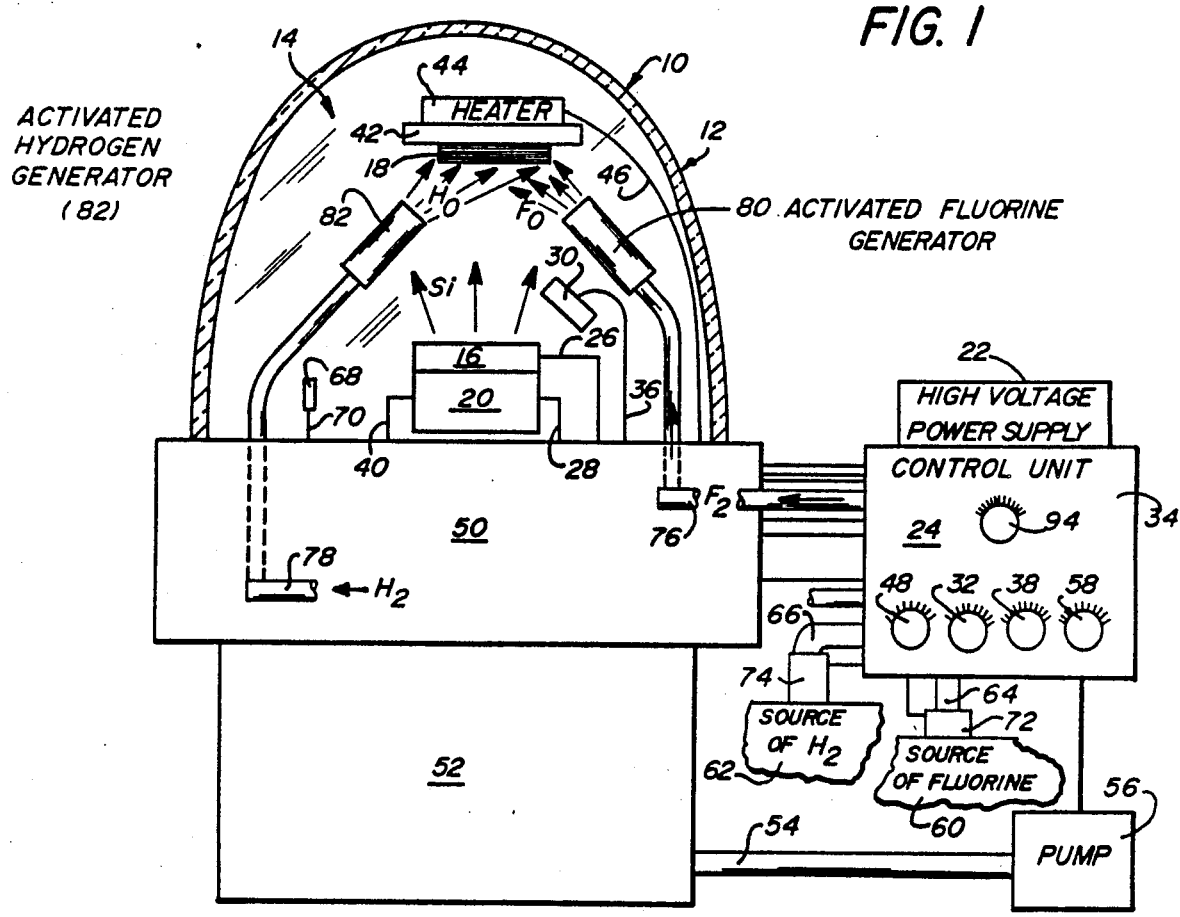
FIG. 1 is a diagrammatic representation of more or less conventional vacuum deposition equipment to which has been added elements for carrying out the addition of fluorine (and hydrogen) by the addition of molecular or fluorine compounds containing fluorine such as $SiF_4$, and hydrogen inlets and activated fluorine and hydrogen generating units which decompose the molecular fluorine and hydrogen within the evacuated space of the vapor deposition equipment, to convert molecular fluorine and hydrogen to activated fluorine and hydrogen and to direct one or both against the substrate during the deposition of an amorphous alloy containing silicon.

Referring now more particularly to FIG. 1, there is shown vapor deposition equipment generally indicated by reference numeral 10, which may be conventional vapor deposition equipment to which is added an activated compensating or altering material injecting means to be described. This equipment, as illustrated, includes a bell jar 12 or similar enclosure enclosing an evacuated space 14 in which is located one or more crucibles like crucible 16 containing the amorphous semiconductor film-producing element or elements to be deposited on a substrate 18. In the form of the invention being described, the crucible 16 initially contains silicon for forming an amorphous alloy containing silicon on the substrate 18 which, for example, may be a metal, crystalline or polycrystalline semiconductor or other material upon which it is desired to form the alloy cells of the present invention. An electron beam source 20 is provided adjacent to the crucible 16, which electron beam source, diagrammatically illustrated, usually includes a heated filament and beam deflection means (not shown) which directs a beam of electrons at the silicon contained in the crucible 16 to evaporate the same.

A high voltage DC power supply 22 provides a suitable high voltage, for example, 10,000 volts DC, the positive terminal of which is connected through a control unit 24 and a conductor 26 to the crucible 16. The negative terminal of which is connected through the control unit 24 and a conductor 28 to the filament of the electron beam source 20. The control unit 24 including relays or the like for interrupting the connection of the power supply 22 to the conductors 26 and 28 when the film thickness of an alloy deposition sampling unit 30 in the evacuated space 14 reaches a given value set by operating a manual control 32 on a control panel 34 of the control unit 24. The alloy sampling unit 30 includes a cable 36 which extends to the control unit 24 which includes well known means for responding to both the thickness of the alloy deposited upon the alloy sampling unit 30 and the rate of deposition thereof. A manual control 38 on the control panel 34 may be provided to fix the desired rate of deposition of the alloy controlled by the amount of current fed to the filament of the electron beam source through a conductor 40 in a well known manner.

The substrate 18 is carried on a substrate holder 42 upon which a heater 44 is mounted. A cable 46 feeds energizing current to the heater 44 which controls the temperature of the substrate holder 42 and substrate 18 in accordance with a temperature setting set on a manual control 48 on the control panel 34 of the control unit 24.

The bell jar 12 is shown extending upwardly from a support base 50 from which the various cables and other connections to the components within the bell jar 12 may extend. The support base 50 is mounted on an enclosure 52 to which connects a conduit 54 connecting to a vacuum pump 56. The vacuum pump 56, which may be continuously operated, evacuates the space 14 within the bell jar 12. The desired pressure of the bell jar is set by a control knob 58 on the control panel 34. In this form of the invention, this setting controls the pressure level at which the flow of activated fluorine (and hydrogen) into the bell jar 12 is regulated. Thus, if the control knob is set to a bell jar pressure of $10^{-4}$ torr, the flow of fluorine (and hydrogen) into the bell jar 12 will be such as to maintain such pressure in the bell jar as the vacuum pump 56 continues to operate.

Sources 60 and 62 of molecular fluorine and hydrogen are shown connected through respective conduits 64 and 66 to the control unit 24. A pressure sensor 68 in the bell jar 12 is connected by a cable 70 to the control unit 24. Flow valves 72 and 74 are controlled by the control unit 24 to maintain the set pressure in the bell jar. Conduits 76 and 78 extend from the control unit 24 and pass through the support base 50 into the evacuated space 14 of the bell jar 12. Conduits 76 and 78 respectively connect with activated fluorine and hydrogen generating units 80 and 82 which convert the molecular fluorine and hydrogen respectively to activated fluorine and hydrogen, which may be atomic and/or ionized forms of these gases. The activated fluorine and hydrogen generating units 80 and 82 can be heated tungsten filaments which elevate the molecular gases to their decomposition temperatures or a plasma generating unit well known in the art for providing a plasma of decomposed gases. Also, activated fluorine and hydrogen in ionized forms formed by plasma can be accelerated and injected into the depositing alloy by applying an electric field between the substrate and the activating source. In either event, the activated fluorine and hydrogen generator units 80 and 82 are preferably placed in the immediate vicinity of the substrate 18, so that the relatively short-lived activated fluorine and hydrogen delivered thereby are immediately injected into the vicinity of the substrate 18 where the cell alloy is depositing. As indicated previously, at least fluorine will be included in the alloy and hydrogen preferably also will be included. The activated fluorine (and hydrogen) as well as other compensating or altering elements also can be produced from compounds containing the elements instead of from a molecular gas source.

As previously indicated, to produce useful amorphous alloys which have the desired characteristics for use in multiple cell photoresponsive devices such as photoreceptors, solar cells, p-n junction current control devices, etc., the compensating or altering agents, materials or elements produce a very low density of localized states in the energy gap without changing the basic intrinsic character of the alloy. This result is achieved with relatively small amounts of activated fluorine and hydrogen so that the pressure in the evacuated bell jar space 14 can still be a relatively low pressure (like $10^{-4}$ torr). The pressure of the gas in the generator can be higher than the pressure in the bell jar by adjusting the size of the outlet of the generator.

The temperature of the substrate 18 is adjusted to obtain the maximum reduction in the density of the localized states in the energy gap of the amorphous alloy involved. The substrate surface temperature will generally be such that it ensures high mobility of the depositing materials, and preferably one below the crystallization temperature of the depositing alloy.

The surface of the substrate can be irradiated by radiant energy to further increase the mobility of the depositing alloy material, as by mounting an ultraviolet light source (not shown) in the bell jar space 14. Alternatively, instead of the activated fluorine and hydrogen generator units 80 and 82 in FIG. 1, these units can be replaced by an ultraviolet light source 84 shown in FIG. 2, which directs ultraviolet energy against the substrate 18. This ultraviolet light will decompose the molecular fluorine (and hydrogen) both spaced from and at the substrate 18 to form activated fluorine (and hydrogen) which diffuses into the depositing amorphous alloy condensing on the substrate 18. The ultraviolet light also enhances the surface mobility of the depositing alloy material.

Figure 2:
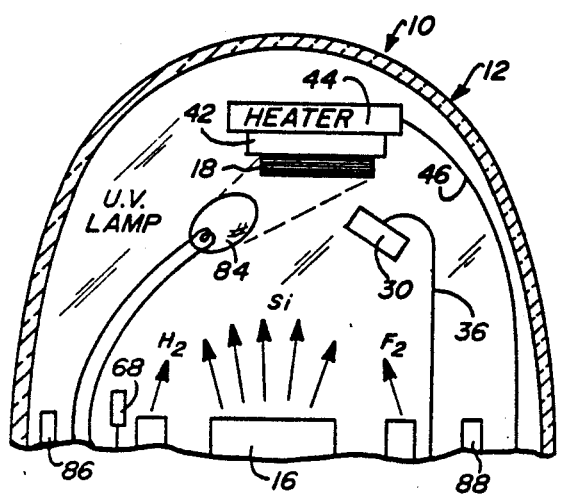
FIG. 2 illustrates vacuum deposition equipment like that shown in FIG. 1, with activated fluorine (and hydrogen) generating means comprising an ultraviolet light source irradiating the substrate during the process of depositing the amorphous alloy, such light source replacing the activated fluorine and hydrogen generator units shown in FIG. 1 and adjusting element generating means.

In FIGS. 1 and 2, the band gap adjusting elements can be added in gaseous form in an identical fashion to the fluorine and hydrogen by replacing the hydrogen generator 82 or by adding one or more activated adjusting element generators 86 and 88 (FIG. 2). Each of the generators 86 and 88 typically will be dedicated to one of the adjusting elements such as germanium, tin, carbon or nitrogen. For example, the generator 86 could supply germanium as in the form of germane gas (GeH$_4$).

Figure 3:
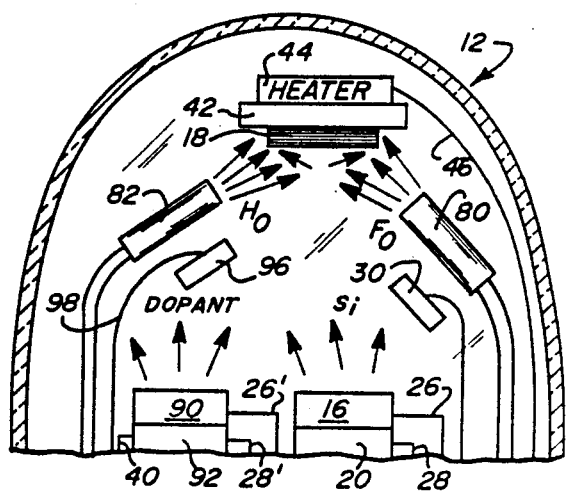
FIG. 3 illustrates the vacuum deposition equipment for FIG. 1 to which has been added additional means for doping the depositing alloy with an n or p conductivity producing material.

Referring now to FIG. 3 which illustrates additions to the equipment shown in FIG. 1 for adding other agents or elements to the depositing cell alloy. For example, an n-conductivity dopant, like phosphorous or arsenic, may be initially added to make the intrinsically modest n-type alloy a more substantially n-type alloy, and then a p-dopant like aluminum, gallium or indium may be added to form a good p-n junction within the cell alloy. A crucible 90 is shown for receiving a dopant like arsenic which is evaporated by bombarding the same with an electron beam source 92, like the beam source 20 previously described. The rate at which the dopant evaporates into the atmosphere of the bell jar 12, which is determined by the intensity of the electron beam produced by the electron beam source 92, is set by a manual control 94 on the control panel 34, which controls the current fed to the filament forming part of this beam source to produce the set evaporation rate. The evaporation rate is measured by a thickness sampling unit 96 upon which the dopant material deposits and which generates a signal on a cable 98 extending between the unit 96, and control unit 24, which indicates the rate of at which the dopant material is deposited on the unit 96.

After the desired thickness of amorphous alloy having the desired degree of n-conductivity has been deposited, evaporation of silicon and the n-conductivity dopant is terminated and the crucible 90 (or another crucible not shown) is provided with a p-conductivity dopant described, and the amorphous alloy and dopant deposition process then proceeds as before to increase the thickness of the amorphous cell alloy with a p-conductivity region therein.

The band adjusting element (s) also can be added by a similar process to that described for the dopant by utilizing another crucible similar to the crucible 90.

In the case where the amorphous alloys comprise two or more elements which are solid at room temperature, then it is usually desirable to separately vaporize each element placed in a separate crucible, and control the deposition rate thereof in any suitable manner, as by setting controls on the control panel 34 which, in association with the deposition rate and thickness sampling units, controls the thickness and composition of the depositing alloy.

While activated fluorine (and hydrogen) are believed to be the most advantageous compensating agents for use in compensating the amorphous cell alloys including silicon, in accordance with broader aspects of the invention, other compensating or altering agents can be used. For example, carbon and oxygen may be useful in reducing the density of localized states in the energy gap when used in small amounts so as not to change the intrinsic characteristics of the cell alloy.

Figure 4:
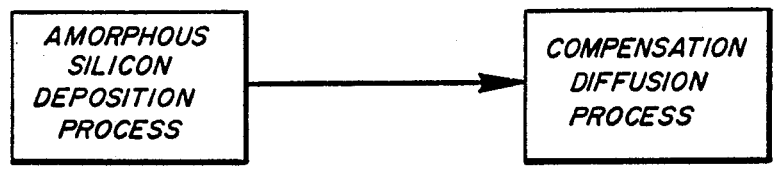
FIG. 4 illustrates an application wherein the deposition of the amorphous alloy and the application of the activated fluorine and hydrogen may be carried out as separate steps in separate enclosures.
Figure 5:
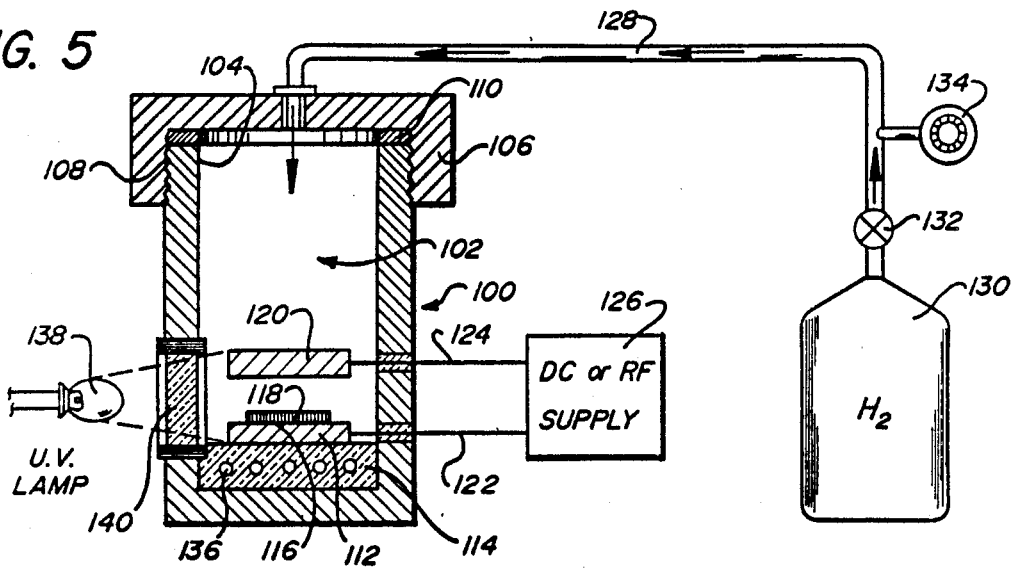
FIG. 5 illustrates exemplary apparatus for diffusing activated hydrogen into a previously deposited amorphous alloy.

As previously indicated, although it is preferred that compensating and other agents be incorporated into the amorphous cell alloy as it is deposited, in accordance with another aspect of the invention, the amorphous cell alloy deposition process and the process of injecting the compensating and other agents into the semiconductor alloy can be done in a completely separate environment from the depositing of the amorphous cell alloy. This can have an advantage in certain applications since the conditions for injecting such agents are then completely independent of the conditions for the alloy deposition. Also, as previously explained, if the vapor deposition process produces a porous cell alloy, the porosity of the alloy, in some cases, is more easily reduced by environment conditions quite different from that present in the vapor deposition process. To this end, reference should now be made to FIGS. 4 and 5 which illustrate that the amorphous cell deposition process and the compensating or altering agent diffusion process are carried out as separate steps in completely different environments, FIG. 5 illustrating apparatus for carrying out the post compensation diffusion process.

As there shown, a low pressure container body 100 is provided which has a low pressure chamber 102 having an opening 104 at the top thereof. This opening 104 is closed by a cap 106 having threads 108 which thread around a corresponding threaded portion on the exterior of the container body 100. A sealing O-ring 110 is sandwiched between the cap 106 and the upper face of the container body. A sample-holding electrode 112 is mounted on an insulating bottom wall 114 of the chamber 100. A substrate 116 upon which an amorphous semiconductor cell alloy 118 has already been deposited is placed on the electrode 112. The upper face of the substrate 116 contains the amorphous cell alloy 118 to be altered or compensated in the manner now to be described.

Spaced above the substrate 116 is an electrode 120. The electrodes 112 and 120 are connected by cables 122 and 124 to a DC or RF supply source 126 which supplies a voltage between the electrodes 112 and 120 to provide an activated plasma of the compensating or altering gas or gases, such as fluorine, hydrogen, and the like, fed into the chamber 102. For purposes of simplicity, FIG. 5 illustrates only molecular hydrogen being fed into the chamber 102 by an inlet conduit 128 passing through the cap 106 and extending from a supply tank 130 of molecular hydrogen. Other compensating or altering gases (such as fluorine and the like) also may be similarly fed into the chamber 102. The conduit 128 is shown connected to a valve 132 near the tank 130. A flow rate indicating gauge 134 is shown connected to the inlet conduit 128 beyond the valve 132.

Suitable means are provided for heating the interior of the chamber 102 so that the substrate temperature is elevated preferably to a temperature below, but near the crystallization temperature of the cell alloy 118. For example, coils of heating wire 136 are shown in the bottom wall 114 of the chamber 102 to which coils connect a cable (not shown) passing through the walls of the container body 100 to a source of current for heating the same.

The high temperature together with a plasma of gas containing one or more compensating elements developed between the electrodes 112 and 120 achieve a reduction of the localized states in the band gap of the cell alloy. The compensating or altering of the amorphous alloy 118 may be enhanced by irradiating the amorphous alloy 118 with radiant energy from an ultraviolet light source 138, which is shown outside of the container body 100 directing ultraviolet light between the electrodes 112 and 120 through a quartz window 140 mounted in the side wall of the container body 100.

The low pressure or vacuum in the chamber 102 can be developed by a vacuum pump (not shown) such as the pump 56 in FIG. 1. The pressure of the chamber 102 can be on the order of 0.3 to 2 Torr with a substrate temperature on the order of 200° to 450° C. The activated fluorine (and hydrogen) as well as other compensating or altering elements also can be produced from compounds containing the elements instead of from a molecular gas source, as previously mentioned.

Figure 6:
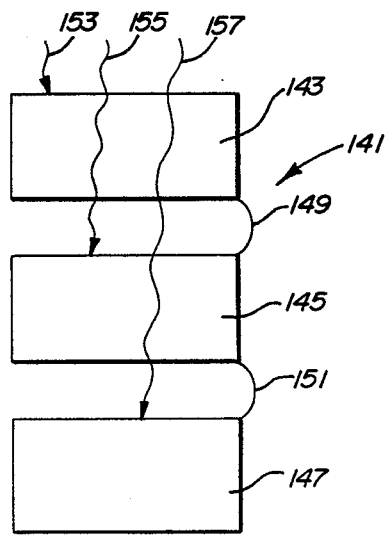
FIG. 6 illustrates one embodiment of a stacked multiple cell device of the invention.

FIG. 6 illustrates a stacked multiple photovoltaic cell device 141 having three electrically separate individual photovoltaic cells 143, 145 and 147. These individual cells can be physically separate, with each cell fabricated on its own separate substrate or they can be physically contiguous, separated by a deposited electrically insulating layer. The three cells, for example, have decreasing band gaps, preferably selected to equalize or match the current generated by each of the cells. The cells are connected by external connections 149 and 151 which can include load matching circuits or can be grids isolated between each cell. For example, cells 143 can be made from an a-Si:F:H alloy with a gap of about 1.9 eV. The cell 145 can be made with a small amount of band adjusting element, such as germanium with a gap of 1.5 eV. The third cell 147 can be made with a larger amount of band adjusting element(s), with a gap of 1.2 eV.

The photon energies absorbed by each cell are indicated by the wavy lines 153, 155 and 157. The lines 153, 155 and 157 represent photon energies of above 1.9 eV, 1.5 eV and 1.2 eV, respectively. The cells also can have graded band gaps if desired. By substantially matching the generated currents from each cell the overall device open circuit voltage Voc is enhanced without substantially decreasing the short circuit current $J_{sc}$.

Figure 7:
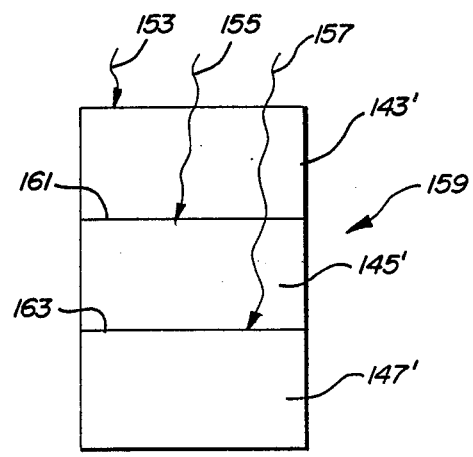
FIG. 7 illustrates one embodiment of a cascade or tandem multiple cell device of the invention.

A tandem or cascade mutliple cell device 159 is illustrated in FIG. 7. This device can be made with the cells of FIG. 6 with the currents from each of the cells matched. The matched current cells 143', 145' and 147' absorb the same photon energies represented by 153, 155 and 157. The cells do not have external connections therebetween, but instead utilize junctions 161 and 163 as the electrical connections between cells. Although the radiant energy discussed above typically is from the solar spectrum, other multiple cell applications utilizing other light sources are also achievable by the invention. Further, although the cell substrates for the cells 143 and 145 must be substantially transparent to the photon energy of interest, the substrates for the cells 147 and 147' are not so restricted. The external connections of the cells 141 and 159 are not shown.

Various types of amorphous alloy cells can be utilized in the multiple cell devices of the present invention such as those devices disclosed in cross-referenced applications Ser. No. 185,520 and Ser. Nos. 206,579; 206,476 and 206,477. As an example, the cell 143 can have an increased band gap as disclosed in Ser. No. 206,476. The cell 145 can be substantially intrinsic or have a band gap adjusted or disclosed in Ser. No. 185,520. The cell 147 can have a band gap adjusted as disclosed in Ser. No. 185,520 or in Ser. No. 206,477 and each of the cells can be graded as disclosed in Ser. No. 206,579.

Figure 8:
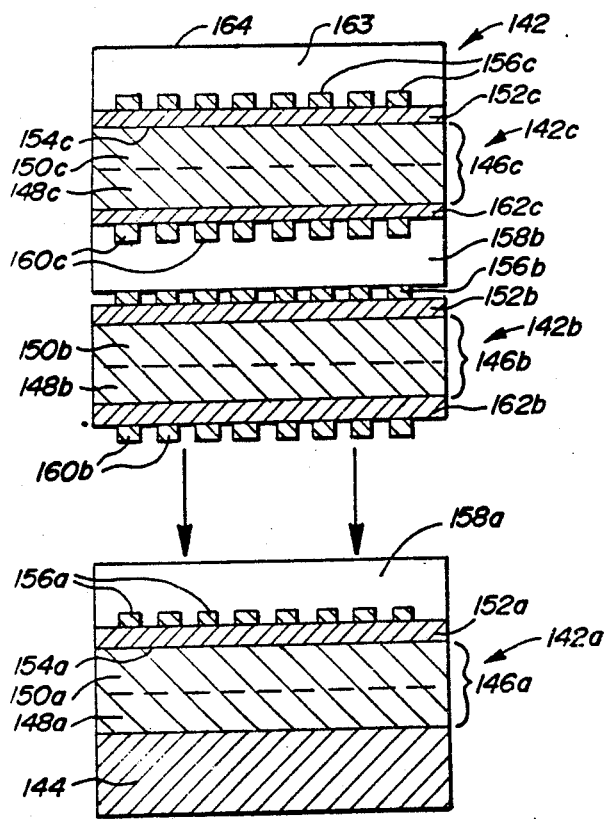
FIG. 8 is a fragmentary sectional view of a stacked multiple cell device embodying the present invention comprising a plurality of Schottky barrier solar cells each including an amorphous semiconductor photoreceptive alloy in accordance with the present invention.

FIG. 8 shows a stacked multiple cell device 142 in fragmentary cross-section which includes a plurality of Schottky barrier solar cells. The solar cell device 142 includes three Schottky barrier solar cells 142a, 142b, and 142c. As indicated by the figure, the device 142 may include additional cells if desired.

The solar cell 142a includes a substrate or electrode 144 of a material having good electrical conductivity properties, and the ability of making an ohmic contact with an amorphous alloy 146a compensated or altered to provide a low density of localized states in the energy gap and with a band gap optimized by the processes of the present invention. The substrate 144 may comprise a semi-transparent metal or a low work function metal, such as aluminum, tantalum, stainless steel or other material matching with the amorphous alloy 146a deposited thereon which preferably includes silicon or germanium, compensated or altered in the manner of the alloys previously described so that it has a low density of localized states in the energy gap. It is most preferred that the alloy have a region 148a next to the electrode 144, which region forms an n-plus conductivity, heavily doped, low resistance interface between the electrode and an undoped relatively high dark resistance region 150a which is an intrinsic, but low n-conductivity region.

The upper surface of the amorphous alloy 146a as viewed in FIG. 8, joins a metallic region 152a, an interface between this metallic region and the amorphous alloy 146a forming a Schottky barrier 154a. The metallic region 152a is transparent or semi-transparent to solar radiation, has good electrical conductivity and is of a high work function (for example, 4.5 eV or greater, produced, for example, by gold, platinum, palladium, etc.) relative to that of the amorphous alloy 146a. The metallic region 152a may be a single layer of a metal or it may be a multi-layer. The amorphous alloy 146a may have a thickness of about 0.5 to 1 micron and the metallic region 152a may have a thickness of about 100 Å in order to be semi-transparent to solar radiation.

On the surface of the metallic region 152 is deposited a grid electrode 156a made of a metal having good electrical conductivity. The grid may comprise orthogonally related lines of conductive material occupying only a minor portion of the area of the metallic region, the rest of which is to be exposed to solar energy. For example, the grid 156a may occupy only about from 5 to 10% of the entire area of the metallic region 152. The grid electrode 156a uniformly collects current from the metallic region 152a to assure a good low series resistance for the device.

An insulating layer 158a is applied over the grid electrode 158a to isolate the cell 142a from its adjacent cell 142b. The insulating layer 158a may be $SiO_2$ or $Si_3N_4$ for example.

The cell 142b and each of the other intermediate cells between the bottom cell 142a and the top cell 142c include a grid electrode 160b deposited on the insulating layer of the adjacent cell such as insulating layer 158a of cell 142a. The grid 160d is preferably identical to the grid 156a and aligned therewith to preclude unnecessary shadowing. Over the grid 160b there is deposited a transparent or semi-transparent metallic region 162b. The metallic region 162b is preferably of good conductivity and high work function like region 152a.

Over the metallic region 162b there is deposited another amorphous alloy 146b which preferably includes silicon and is compensated or altered in the manner of the alloys previously described. The alloy 146b includes a region 148b next to the metal 162b which forms an n-plus conductivity, heavily doped, low resistance interface between the metal 162b and an undoped relatively high dark resistance region 150b which is an intrinsic, but low n-conductivity region. Preferably, the alloy 146b is band gap adjusted in a manner previously described so that the band gap of the alloy 146b is higher than the band gap of the alloy 146a.

Like the cell 142a, the cell 142b includes a transparent or semi-transparent metallic region 152b forming a Schottky barrier at 154b and a grid electrode 156b over the region 152b. Deposited over the grid electrode 156b is another insulating layer 158b to isolate the cell 142b from the cell 142c.

The top cell 142c is essentially identical to the intermediate cell 142b except that it does not include an insulating layer but instead has an anti-reflection layer 163 deposited over the grid electrode 156c. Also, the amorphous alloy 146c including the n-plus region 148c and the slightly n-conductivity, intrinsic, and high dark resistance region 150c is band gap adjusted to have a band gap which is greater than the band gap of the alloy 146b.

An anti-reflection layer 163 may be applied over the grid electrode 156c and the areas of the metallic region 152c between the grid electrode areas. The anti-reflection layer 163 has a solar radiation incident surface 164 upon which impinges the solar radiation. For example, the anti-reflection layer 163 may have a thickness on the order of magnitude of the wavelength of the maximum energy point of the solar radiation spectrum, divided by four times the index of refraction of the anti-reflection layer 163. If the metallic region 152c is platinum of 100 Å in thickness, a suitable anti-reflection layer 163 would be zirconium oxide of about 500 Å in thickness with an index of refraction of 2.1.

The band adjusting element(s) are added at least to the photocurrent generating regions 150a, 150b and 150c. The Schottky barriers 154a, 154b and 154c formed at the interface between the regions 150a and 152a, 150b and 152b, and 150c and 152c respectively enable the photons from the solar radiation to produce current carriers in the alloys 146a, 146b and 146c, which are collected as current by the grid electrode 156a, 156b and 156c. All of the grids are preferably alligned to preclude unnecessary shadowing. Also, an oxide layer (not shown) on the order of 30 Å thick can be added between each of the layers 150a and 152a, 150b and 152b, and 150c and 152c to produce a stacked MIS (metal insulator semiconductor) solar cell device.

Figure 9:
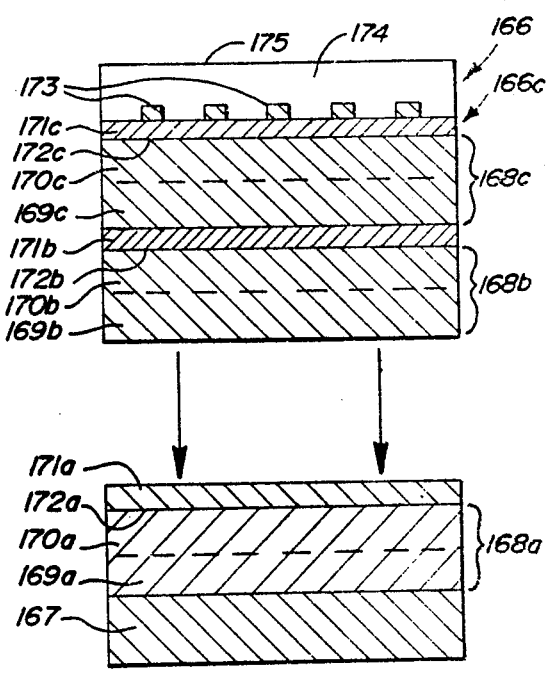
FIG. 9 is a fragmentary sectional view of a tandem or cascade multiple cell device comprising a plurality of Schottky barrier solar cells each including an amorphous semiconductor alloy in accordance with the present invention.

FIG. 9 shows a tandem or cascade multiple cell device 166 in fragmentary cross-section which also includes a plurality of Schottky barrier solar cells. The solar cell device 166 includes three Schottky barrier solar cells 166a, 166b and 166c. As indicated by the figure the device 166 may include additional cells if desired.

The solar cell 166a includes a substrate or electrode 167 of a material having good electrical conductivity properties, and the ability of making an ohmic contact with an amorphous alloy 168a compensated or altered to provide a low density of localized states in the energy gap and with a band gap optimized by the processes of the present invention. The substrate 167 may comprise a transparent or semi-transparent metal or a low work function metal, such as aluminum, tantalum, stainless steel or other material matching with the amorphous alloy 168a deposited thereon which preferably includes silicon or germanium, compensated or altered in the manner of the alloys previously described so that it has a low density of localized states in the energy gap. It is most preferred that the alloy have a region 169a next to the electrode 167, which region forms an n-plus conductivity, heavily doped, low resistance interface between the electrode and an undoped relatively high dark resistance region 170a which is an intrinsic, but low n-conductivity region.

The upper surface of the amorphous alloy 168a as viewed in FIG. 9, joins a metallic region 171a, an interface between this metallic region and the amorphous alloy 168a forming a Schottky barrier 172a. The metallic region 171a is transparent or semi-transparent to solar radiation, has good electrical conductivity and is of a high work function (for example, 4.5 eV or greater, produced, for example, by gold, platinum, palladium, etc.) relative to that of the amorphous alloy 168a. The metallic region 171a may be a single layer of a metal or it may be a multi-layer. The amorphous alloy 168a may have a thickness of about 0.5 to 1 micron and the metallic region 171a may have a thickness of about 100 Å in order to be semi-transparent to solar radiation.

The cell 166b and all other intermediate cells between the bottom cell 166a and top cell 166c include an amorphous alloy 168b which preferably includes silicon and is compensated or altered in the manner of the alloys previously described. The alloy 168b includes a region 169b next to the metal 171a which forms an n-plus conductivity, heavily doped, low resistance interface between the metal 171a and an undoped relatively high dark resistance region 170b which is an intrinsic, but low n-conductivity region. Preferably, the alloy 168b, at least in region 170b, is band gap adjusted in a manner previously described so that the band gap of the alloy 168b is higher than the band gap of the alloy 168a. Like the cell 166a, the cell 166b includes a transparent or semi-transparent metallic region 171b forming a Schottky barrier at 172b.

The top cell 166c is essentially identical to the intermediate cell 166b except that it further includes a grid electrode 173 and an anti-reflection layer 174 deposited over the grid electrode 173. Also, the amorphous alloy 168c including the n-plus region 169c and the slightly n-conductivity, intrinsic, and high dark resistance region 170c is band gap adjusted, at least in region 170c, to have a band gap which is greater than the band gap of the alloy 168b.

The grid electrode 173 on the surface of the metallic region 152 is made of a metal having good electrical conductivity. The grid may comprise orthogonally related lines of conductive material occupying only a minor portion of the area of the metallic region, the rest of which is to be exposed to solar energy. For example, the grid 173 may occupy only about from 5 to 10% of the entire area of the metallic region 171c. The grid electrode 173 uniformly collects current from the metallic region 171c to assure a good low series resistance from the device.

The anti-reflection layer 174 may be applied over the grid electrode 173 and the areas of the metallic region 171c between the grid electrode areas. The anti-reflection layer 174 has a solar radiation incident surface 175 upon which impinges the solar radiation. For example, the anti-reflection layer 174 may have a thickness on the order of magnitude of the wavelength of the maximum energy point of the solar radiation spectrum, divided by four times the index of refraction of the anti-reflection layer 174. If the metallic region 171c is platinum of 100 Å in thickness, a suitable anti-reflection layer 174 would be zirconium oxide of about 500 Å in thickness with an index of refraction of 2.1.

The band adjusting element(s) are added to the photocurrent generating regions 170a, 170b and 170c. The Schottky barriers 172a, 172b and 173c formed at the interface between the regions 170a and 171a, 170b and 171b, and 170c and 171c respectively enable the photons from the solar radiation to produce current carriers in the alloys 168a, 168b and 168c, which are collected as current by the grid electrode 173. An oxide layer on the order of 30 Å in thickness (not shown) can be added between the layers 170a and 171a, 170b and 171b, and 170c and 171c to produce a tandem or cascade MIS (metal insulator semiconductor) multiple solar cell device.

As used herein, the terms compensating agents or materials and altering agents, elements or materials mean materials which are incorporated in an amorphous cell alloy for altering or changing the structure thereof, such as, for example, activated fluorine (and hydrogen) incorporated in the amorphous alloy containing silicon to form an amorphous silicon/fluorine/-hydrogen composition alloy, having a desired band gap and a low density of localized states in the energy gap. The activated fluorine (and hydrogen) is bonded to the silicon in the alloy and reduces the density of localized states therein and due to the small size of the fluorine and hydrogen atoms they are both readily introduced into the amorphous alloy without substantial dislocation of the silicon atoms and their relationships in the amorphous alloy. This is true most particularly because of the extreme electronegativity, specificity, small size and reactivity of fluorine, all of which characteristics help influence and organize the local order of the alloys. In creating this new alloy the strong inductive powers of fluorine and its ability to act as an organizer of short range order is of importance. The ability of fluorine to bond with both silicon and hydrogen results in the formation of new and superior alloys with a minimum of localized defect states in the energy gap. Hence, fluorine and hydrogen are introduced without substantial formation of other localized states in the energy gap to form the new alloys.

In addition to the stacked and tandem or cascade Schottky barrier or MIS multiple solar cells shown in FIGS. 8 and 9, there are solar cell constructions which utilize p-i-n junctions in the body of the amorphous alloy forming a part thereof formed in accordance with successive deposition, compensating or altering and doping steps like that previously described. These other forms of solar cells are generically illustrated in FIGS. 10 and 11.

Figure 10:
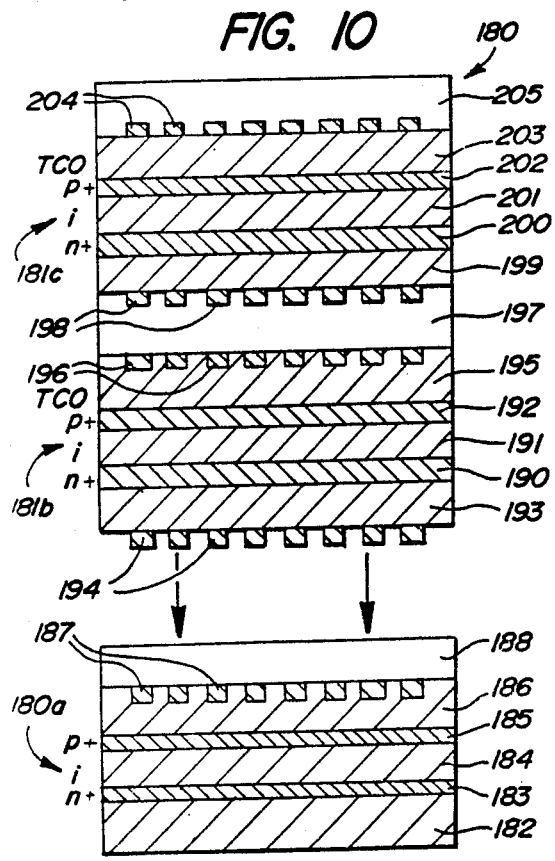
FIG. 10 is a fragmentary sectional view of a stacked multiple cell device comprising a plurality of p-i-n solar cells each including an amorphous semiconductor alloy in accordance with the present invention.

Referring now to FIG. 10, a stacked multiple cell device 180 including a plurality of p-i-n solar cells 181a, 181b and 181c is illustrated. The bottom cell 181a has a substrate 182 which may be transparent or semi-transparent or formed from stainless steel or aluminum. The substrate 182 is of a width and length as desired and preferably at least 3 mils thick. Over the substrate 182 there is deposited a low light absorption, high conductivity n-plus layer 183. Over the n-plus layer 183, there is deposited an intrinsic alloy layer 184 having an adjusted band gap, high light absorption, low dark conductivity and high photoconductivity including sufficient amounts of the adjusting element(s) to optimize the band gap thereof. Deposited over the intrinsic layer 184 is a p-plus layer. 185 having low light absorption and high conductivity. Applied over the p-plus layer 185 is a TCO (transparent conductive oxide) layer 186 which, for example, may be indium tin oxide (ITO), cadmium stannate ($Cd_2SnO_4$), or doped tin oxide ($SnO_2$). An electrode grid 187 is added to the TCO layer 186 which may take the form of the grids previously described.

Cell 181a must be isolated from its adjacent cell 181b. To that end, an insulating layer 188 is applied over the grid 187 which layer 188 may be formed from $SiO_2$ or $Si_3N_4$, for example.

The cell 181b and all other intermediate cells which may be added as indicated in the figure include an amorphous alloy body 189 including an n-plus layer 190, an intrinsic layer 191, and a p-plus layer 192. Each of these layers preferably exhibit the same electrical and photo conductive properties of the corresponding layers of the cell 181a. However, the intrinsic layer 191 is band gap adjusted to have a band gap which is greater than the band gap of intrinsic layer 184.

To facilitate current collection, a transparent or semi-transparent contact oxide 193 and grid electrode 194 are provided between the n-plus layer 190 and the insulating layer 188. The layer 193 may be formed from tin oxide, for example. Similarly, a TCO layer 195 and grid electrode 196 are provided adjacent the p-plus layer 192. The intermediate cell 181b is isolated from the top cell 181c by a layer of insulating material 197 such as $SiO_2$ or $Si_3N_4$, for example.

The top cell 181c is substantially identical to the intermediate cell 181b. It also includes a grid electrode 198, a transparent or semi-transparent contact oxide 199, an n-plus region 200, an intrinsic region 201, a p-plus region 202, a TCO layer 203, and a grid electrode 204. In addition, an anti-reflection layer 205 is provided over the grid electrode 204 and the intrinsic region is preferably band gap adjusted in a manner previously described to have a band gap which is greater than the band gap of intrinsic layer 191 of cell 181b.

To insure maximum cell efficiency, the grids should all be aligned to preclude unnecessary shadowing. Also, as will be appreciated, an n-i-p multiple cell device may be obtained by reversing the order of the n-plus and p-plus layers or regions.

Figure 11:
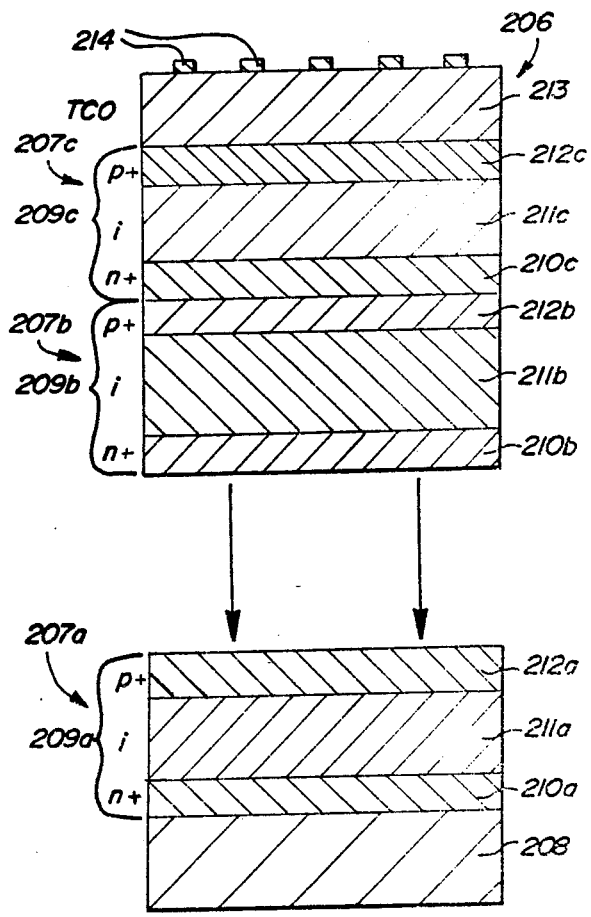
FIG. 11 is a fragmentary sectional view of a tandem or cascade multiple cell device comprising a plurality of p-i-n solar cells each including an amorphous semiconductor alloy in accordance with the present invention.

Referring now to FIG. 11, a tandem or cascade multiple cell device 206 also including a plurality of p-i-n solar cells 207a, 207b and 207c is illustrated. The bottom cell 207a has a substrate 208 which may be transparent or semi-transparent or formed from stainless steel or aluminum. Each of the cells 207a, 207b, and 207c includes an amorphous alloy body 209a, 209b and 209c respectively containing at least silicon. Each of the alloy bodies includes an n-plus region or layer 210a, 210b and 210c an intrinsic region or laer 211a, 211b and 211c, and a p-plus region or layer 212a, 212b and 212c. Cell 207b comprises an intermediate cell and, as indicated in the figure, additional intermediate cells may be incorporated into the device if desired. Also, an n-i-p multiple cell device may be obtained by reversing the order of the n-plus and p-plus layers or regions.

For each of the cells 207a, 207b and 207c illustrated in FIG. 11, the p+ layers are low light absorption, high conductivity alloy layers. The intrinsic alloy layers have an adjusted wavelength threshold for a solar photoresponse, high light absorption, low dark conductivity and high photoconductivity including sufficient amounts of the adjusting element(s) to optimize the band gap for the cell application. Preferably, the intrinsic layers are band gap adjusted so that cell 207a has the lowest band gap, cell 207c has the highest band gap and cell 207b has a band gap in between the other two. The bottom alloy layers are a low light absorption, high conductivity n+ layer. The thickness of the n+ doped layers is preferably in the range of about 50 to 500 angstroms. The thickness of the amorphous adjusting element containing intrinsic alloy layers is preferably between about 3,000 angstroms to 30,000 angstroms. The thickness of the p+ layers also is preferably between about 50 to 500 angstroms. Due to the shorter diffusion length of the holes, the p+ layers generally will be as thin as possible on the order of 50 to 150 angstroms. Further, the outer most layer (here p+ layer 212c) will be kept as thin as possible to avoid absorption of light in that contact layer and generally will not include the band gap adjusting element(s).

Following the deposition of the various semiconductor alloy layers in the desired order for the cells 209a, 209b and 209c, a further deposition step is performed, preferably in a separate deposition environment. Desirably, a vapor deposition environment is utilized since it is a fast deposition process. In this step, a TCO layer 213 (transparent conductive oxide) is added which, for example, may be indium tin oxide (ITO), cadmium stannate ($Cd_2SnO_4$), or doped tin oxide ($SnO_2$). The TCO layer will be added following the post compensation of fluorine (and hydrogen) if the alloys were not deposited with one or more of the desired compensating or altering elements therein.

An electrode grid 214 can be added to the device if desired. For a device having a sufficiently small area, the TCO layer 213 is generally sufficiently conductive such that the grid 214 is not necessary for good device efficiency. If the device is of a sufficiently large area or if the conductivity of the TCO layer 213 is insufficient, the grid 214 can be placed on the layer 213 to shorten the carrier path and increase the conduction efficiency of the device.

The band gaps of each of the cells forming the devices of FIGS. 8, 9, 10 and 11 may also be graded in the intrinsic or active photoresponsive region thereof. Such grading may be accomplished as fully described in copending application Case 537 filed concurrently herewith.

Figure 12:
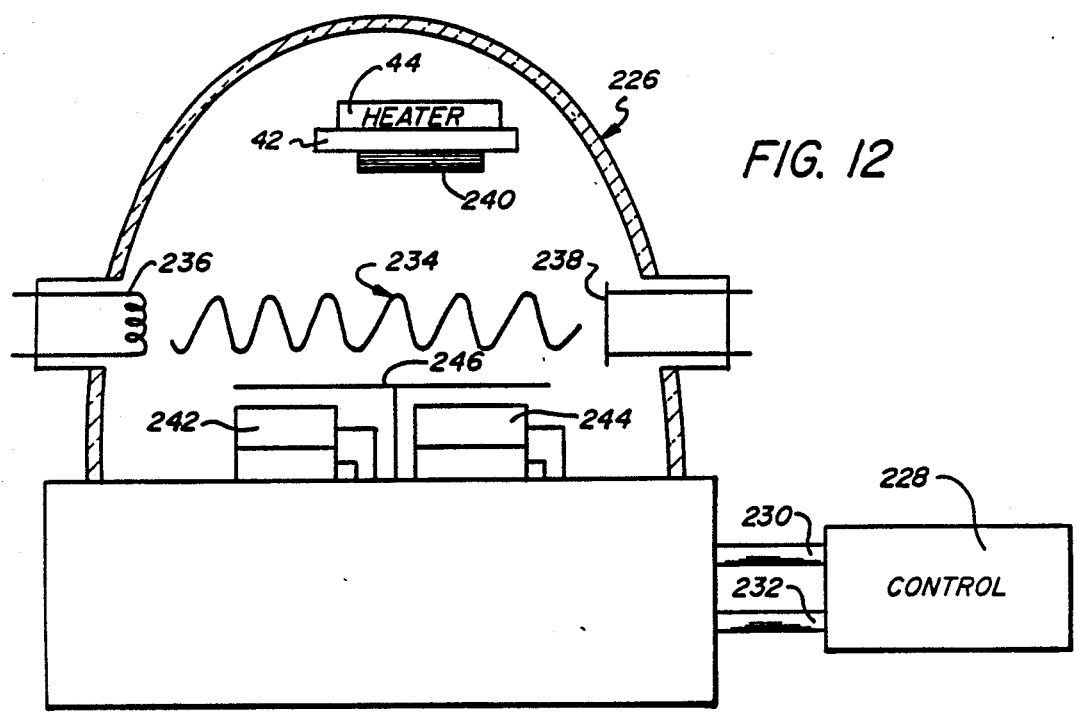
FIG. 12 is a diagrammatic representation of a plasma activated vapor deposition system for depositing the amorphous alloy cells with the adjusting element(s) of the invention incorporated therein.
Figure 13:
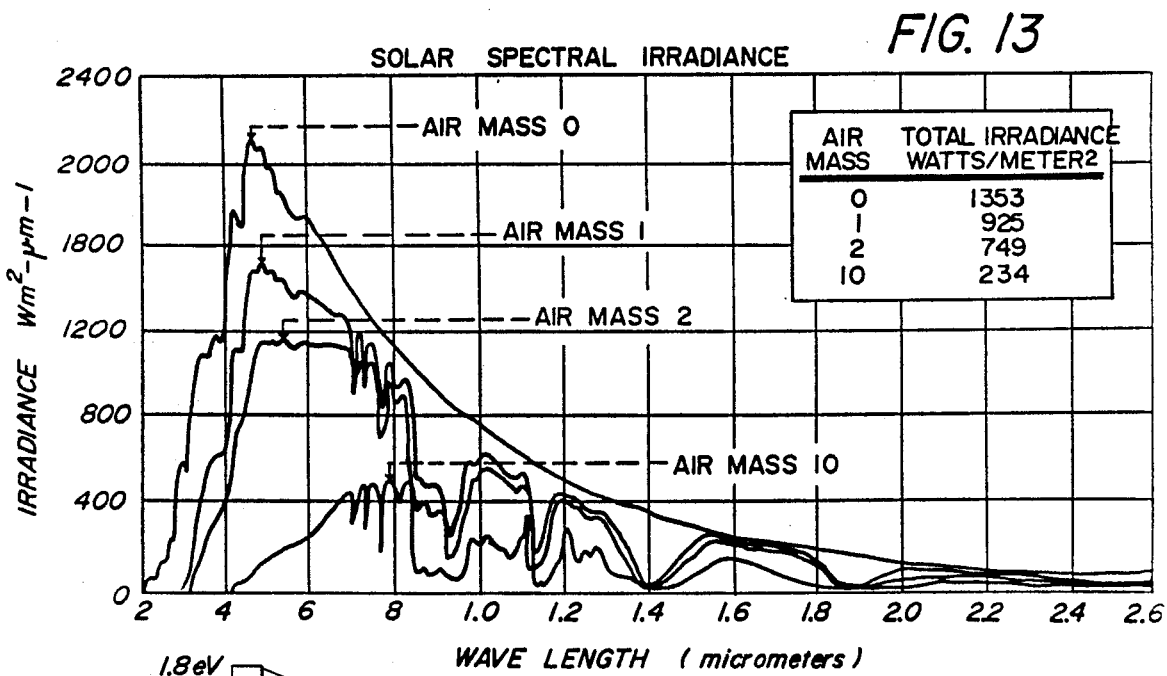
FIG. 13 is a solar spectral irradiance chart illustrating the standard sunlight wavelengths available for various photoresponsive applications.

Referring now to FIG. 12, one embodiment of a plasma activated vapor deposition chamber 226 is illustrated in which the semiconductor and band adjusting element(s) of the invention can be deposited. A control unit 228 is utilized to control the deposition parameters, such as pressure, flow rates, etc., in a manner similar to that previously described with respect to the unit 24 (FIG. 1). The pressure would be maintained at about $10^{-3}$ Torr or less.

One or more reaction gas conduits, such as 230 and 232, can be utilized to supply gases such as silicon tetrafluoride ($SiF_4$) and hydrogen ($H_2$) into a plasma region 234. The plasma region 234 is established between a coil 236 fed by a DC power supply (not illustrated) and a plate 238. The plasma activates the supply gas of gases to supply activated fluorine (and hydrogen) to be deposited on a substrate 240. The substrate 240 may be heated to the desired deposition temperature by heater means as previously described.

The band adjusting element(s) and silicon can be added from two or more evaporation boats, such as 242 and 244. The boat 242 could for example contain germanium and the boat 244 would contain silicon. The elements in boats 242 and 244 can be evaporated by electron beam or other heating means and are activated by the plasma.

If it is desired to layer the band adjusting element(s) in the photogenerating region of the film being deposited, a shutter 246 can be utilized. The shutter could rotate layering separate band adjusting elements from two or more of the boats or can be utilized to control the depositing of the band adjusting element from the boat 242 (or others) to provide layers in the film or to vary the amount of band adjusting element deposited in the film. Thus, the band adjusting element(s) can be added discreetly in layers, in substantially constant or in varying amounts.

FIG. 15 illustrates the available sunlight spectrum. Air Mass O (AMO) being the sunlight available with no atmosphere and the sun directly overhead. AM1 corresponds to the same situation after filtering by the earth's atmosphere. Crystalline silicon has an indirect band gap of about 1.1 to 1.2 eV, which corresponds to the wavelength of about 1.0 micrometer (microns). This equates to losing, i.e. not generating useful photons, for substantially all the light wavelengths above 1.0 microns. As utilized herein, band gap or E optical is defined as the extrapolated intercept of a plot of $(\alpha set\ h\omega)^{\frac{1}{2}}$, where $\alpha$ is the absorption coefficient and set $h\omega$(or e) is the photon energy. For light having a wavelength above the threshold defined by the band gap, the photon energies are not sufficient to generate a photocarrier pair and hence do not add any current to a specific device.

Figure 14:
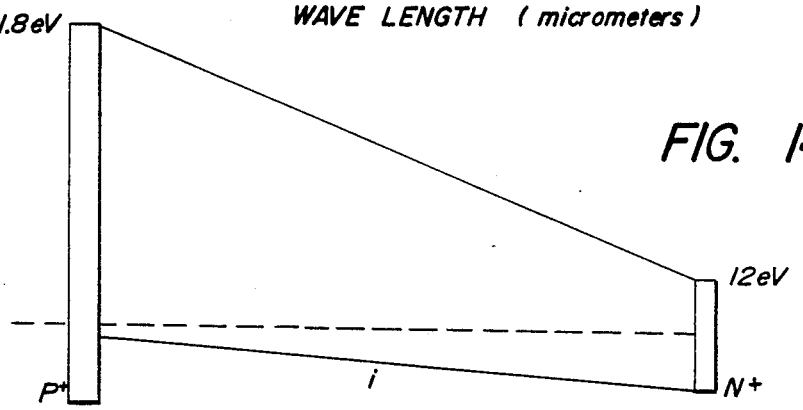
FIG. 14 illustrates one type of a p-i-n solar cell having a band gap which is graded in accordance with the present invention.

Referring now to FIG. 14, a p-i-n solar cell having a band gap which is graded by a method embodying the present invention is therein illustrated. The band gap gap of the intrinsic region from the n+ region to the p+ region is graded from about 1.2 eV to about 1.8 eV, for example by adding one or more band gap adjusting element(s). The intrinsic (i) region may be formed from amorphous Si:F deposited in a manner to be described subsequently. The lowest band gap of 1.2 eV may be achieved by adding germanium or tin to the intrinsic region as it is deposited. The gap may be increased from that value by reducing the amount of germanium added during the deposition of the intrinsic layer. The final band gap value of 1.8 eV may be reached by terminating the addition of the band adjusting element(s) germanium or tin near the end of the intrinsic layer deposition prior to depositing the p+ layer. Further, by adding the adjusting element(s) which increase the band gap such as nitrogen or carbon, the band gap may be increased to 1.8 eV or above near to the p+ region. The nitrogen may be added in the form of a ammonia ($NH_3$) and the carbon may be added in the form of methane ($CH_4$). As will be described in detail hereinafter, the band adjusting element may be added to provide the graded band gap while still maintaining high quality electronic qualities and photoconductivity in the cell due to the inclusion of one or more of fluorine and hydrogen into the alloy.

By virtue of the graded band gap, improved utilization of solar energy for the generation of electron whole pairs is achieved. Further, because band adjusting element(s) may be added in any amounts various forms of grading (i.e., continuous, intermittent or step) can be achieved. Additionally, the n+ and p+ layers may also be graded in the same manner or by selective doping. The band gap can be narrowed below 1.2 eV by introducing tin into the alloy.

Not only does the graded band gap provide improved solar energy utilization, it also creates an electric field substantially throughout the device which assists in carrier collection. As will be appreciated, volume recombination predominates in an amorphous silicon in the absence of electric fields. This reduces the collection efficiency since carriers photogenerated outside the depletion region or lost. However, by virtue of the graded band gap, a built-in electric field is created decreasing the transit time compared to the carrier lifetime so that substantially all of the carriers are collected, provided the field exceeds a minimum value throughout the semiconducting region. It will also be noted in FIG. 14 that the valence band has been tilted. As illustrated, it is inclined from the n+ layer to the p+ layer. This slight tilting allows the photogenerated holes to drift toward the p+ layer for collection. Such tilting may be accomplished by selectively doping in small amounts as the intrinsic layer is deposited. Such an effect may also be achieved not by doping but instead by space charge build-up. Once such a space charge region is present, the generated holes will be free to move toward the p+ layer for collection.

By grading the band gap in the manner represented in FIG. 14, there will be some slight reduction of $V_{oc}$ over a single band gap alloy of 1.8 eV, since the lowest band gap in the graded alloy essentially determines $V_{oc}$. $J_{sc}$, however, is increased due to the more efficient use of solar energy for electron-whole generation and the more efficient collection of the generated carriers. Therefore, the overall device operation can be enhanced especially through utilization where higher currents but lower voltages are required or acceptable. Widening the band gap above 1.8 eV also increases the amount of sunlight available for use in the device.

Each of the device semiconductor alloy layers can be glow discharge deposited upon the base electrode substrate by a conventional glow discharge chamber described in the aforesaid U.S. Pat. No. 4,226,898. The alloy layers also can be deposited in a continuous process described in copending U.S. application Ser. No. 151,301, a Method of Making P-Doped Silicon Films and Devices Made Therefrom, Masatsugu Izu, Vincent D. Cannella and Stanford R. Ovshinsky, filed May 19, 1980, now U.S. Pat. No. 4,400,409. In these cases, the glow discharge system initially is evacuated to approximately 1 mTorr to purge or eliminate impurities in the atmosphere from the deposition system. The alloy material preferably is then fed into the deposition chamber in a compound gaseous form, most advantageously as silicon tetrafluoride ($SiF_4$) hydrogen ($H_2$) and for example, germane ($GeH_4$). The glow discharge plasma preferably is obtained from the gas mixture. The deposition system in U.S. Pat. No. 4,226,898 preferably is operated at a pressure in the range of about 0.3 to 1.5 Torr, preferably between 0.6 to 1.0 Torr such as about 0.6 Torr.

The semiconductor material is deposited from a self-sustained plasma onto the substrate which is heated, preferably by infrared means to the desired deposition temperature for each alloy layer. The doped layers of the devices are deposited at various temperatures in the range of 200° C. to about 1000° C., depending upon the form of the material used. The upper limitation on the substrate temperature in part is due to the type of metal substrate utilized. For aluminum the upper temperature should not be above about 600° C. and for stainless steel it could be above about 1000° C. For an initially hydrogen compensated amorphous alloy to be produced, such as to form the intrinsic layer in n-i-p or p-i-n devices, the substrate temperature should be less than about 400° C. and preferably about 300° C.

The doping concentrations are varied to produce the desired p, p+, n or n+ type conductivity as the alloy layers are deposited for each device. For n or p doped layers, the material is doped with 5 to 100 ppm of dopant material as it is deposited. For n+ or p+ doped layers the material is doped with 100 ppm to over 1 percent of dopant material as it is deposited. The n dopant material can be conventional dopants or the method and materials described in U.S. Pat. No. 4,400,409 deposited at the respective substrate temperatures preferably in the range of 100 ppm to over 5000 ppm for the p+ material.

The glow discharge deposition process in U.S. Pat. No. 4,400,409 includes an AC signal generated plasma into which the materials are introduced. The plasma preferably is sustained between a cathode and substrate anode with an AC signal of about 1 kHz to 13.6 MHz.

Although the multiple cell devices of the invention can utilize various amorphous alloy layers, it is preferable that they utilize cells with the fluorine and hydrogen compensated glow discharge deposited alloys. In this case, a mixture of silicon tetrafluoride and hydrogen is deposited as an amorphous compensated alloy material at or below about 400° C., for the n-type layer. The band adjusted intrinsic amorphous alloy layer and the p+ layer can be deposited upon the electrode layer at a higher substrate temperature above about 450° C. which will provide a material which is fluorine compensated.

As one example, a mixture of the gases $GeH_4 + Ar + SiF_4 + H_2$ having relative percentage of $GeH_4$ to $SiF_4$ in the range of 0.001 to 1% produces photoresponsive alloys having the adjusted band gaps without losing the desired electronic properties. The mixture has a ratio of $SiF_4$ to $H_2$ of 4 to 1 to 10 to 1. The amount of the adjusting element(s) in the resulting alloy is much greater than the gas percentages and can be significantly above twenty percent depending upon the application. Argon is useful as a diluent but is not essential.

Further, although the band gap adjusting element(s) are added at least to the photoresponsive region of the cells, the element(s) also can have utility in the other alloy layers of the devices. As previously mentioned, the alloy layers other than the intrinsic alloy layer can be other than amorphous layers, such as polycrystalline layers. (By the term "amorphous" is meant an alloy or material which has long range disorder, although it may have short or intermediate order or even contain at times some crystalline inclusions).

Modifications and variations of the present invention are possible in light of the above teachings. It is therefore, to be understood that within the scope of the appended claims the invention may be practiced otherwise than as specifically described.

What is claimed and desired to be secured by Letters Patent of the United States is:

1. An improved photoresponsive tandem multiple cell device, said device comprising:
   at least first and second superimposed solar cells;

said first cell being formed of an amorphous silicon alloy material;

said second amorphous silicon alloy cell having an active photoresponsive region in which radiation can impinge to produce charge carriers, said amorphous silicon alloy cell body including at least one element for reducing the density of defect states to about $10^{16}$ defects per cubic centimeter and a band gap adjusting element graded through at least a portion of the photoresponsive region thereof to enhance the radiation absorption;

said adjusting element being germanium, and the band gap of said cell being adjusted for a specified photoresponse wavelength threshold function different from said first cell;

said second cell being a multi-layer body having deposited silicon alloy layers of opposite (p and n) conductivity type, the n-type layer being formed by introducing during the deposition of the layer an n-dopant element and the p-type layer being formed by introducing during deposition of the layer a p-dopant element, and having deposited between said p and n doped layers said active photoresponsive region formed of substantially intrinsic amorphous silicon alloy; and said first cell being formed with said second cell in substantially direct junction contact therebetween, said first and second cells designed to generate substantially matched currents from each cell from a light source directed through said first cell and into said second cell.

2. The device as in claim 1 wherein said first cell also includes an active photoresponsive region in which radiation can impinge to produce charge carriers; a band gap adjusting element graded through at least a portion of said region; said band gap adjusting element being selected from the group consisting essentially of carbon, nitrogen, oxygen, and combinations thereof.

3. The device as in claim 2 wherein said photoresponsive region of at least said first or said second cells includes said adjusting element in substantially discrete layers.

4. The device as in claim 2 wherein said photoresponsive region of at least one of said first or said second cells includes said adjusting element in uniformly varying amounts.

5. The device as in claim 2 further including a third superimposed solar cell formed of an amorphous silicon alloy material; said third cell having an active photoresponsive region in which radiation can impinge to produce charge carriers; and a band gap adjusting element graded through at least a portion of said region; said band gap adjusting element being germanium.

6. The device as in claim 5 wherein said third cell is operatively positioned below said first cell and has a band gap less than the band gap of said first cell.

7. The device as in claim 1 further including a second density of states reducing element incorporated therein; said first reducing element being hydrogen and said second reducing element being fluorine.

8. The device as in claim 1 said first cell also includes a photoresponsive region and wherein both of said photoresponsive regions of said first and second cells form part of a p-i-n device.

* * * * *